United States Patent
Krishnaraj et al.

(10) Patent No.: US 6,633,076 B2
(45) Date of Patent: Oct. 14, 2003

(54) METHODS AND APPARATUS FOR PRODUCING STABLE LOW K FSG FILM FOR HDP-CVD

(75) Inventors: Padmanabhan Krishnaraj, San Francisco, CA (US); Robert Duncan, San Jose, CA (US); Joseph D'Souza, Sunnyvale, CA (US); Alan W. Collins, San Francisco, CA (US); Nasreen Chopra, Belmont, CA (US); Kimberly Branshaw, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/283,996

(22) Filed: Oct. 30, 2002

(65) Prior Publication Data

US 2003/0064556 A1 Apr. 3, 2003

Related U.S. Application Data

(62) Division of application No. 09/818,359, filed on Mar. 26, 2001, now Pat. No. 6,511,922.

(51) Int. Cl.$^7$ .............................................. H01L 31/00
(52) U.S. Cl. ........................................................ 257/641
(58) Field of Search ................................ 257/641, 644, 257/650, 760, 758

(56) References Cited

U.S. PATENT DOCUMENTS

| | | |
|---|---|---|
| 5,827,785 A | 10/1998 | Bhan et al. |
| 5,869,149 A | 2/1999 | Denison et al. |
| 6,001,728 A | 12/1999 | Bhan et al. |
| 6,077,764 A | 6/2000 | Sugiarto et al. |
| 6,090,167 A | 7/2000 | Bhan et al. |
| 6,121,164 A | 9/2000 | Yieh et al. |
| 6,136,685 A | 10/2000 | Narwankar et al. |
| 6,289,843 B1 | 9/2001 | Gupta et al. |
| 6,303,518 B1 | 10/2001 | Tian et al. |

FOREIGN PATENT DOCUMENTS

| | | |
|---|---|---|
| EP | 0 599 730 A | 6/1994 |
| EP | 0 759 481 A1 | 6/1996 |
| EP | 0 883 166 A | 4/1998 |
| WO | WO97/30188 | 8/1997 |

OTHER PUBLICATIONS

Falcony, C. et al., "Low Temperature SiO$_2$ Films," Thin Solid Films, vol. 199, pp. 269–278 (1991).
Falcony, C. et al., "Low Temperature SiO$_2$ Films," Thin Solid Films, vol. 193/194 pp. 637–647 (1990)
Qian, L.Q. et al. "High Density Plasma Deposition and Deep Submicron Gap Fill with Low Dielectric Constant SiOF Films," DUMIC Conference (1995), 1995 ISMIC—101D/95/0050.

Primary Examiner—Hoai Ho
Assistant Examiner—Thao Le
(74) Attorney, Agent, or Firm—Townsend and Townsend and Crew

(57) ABSTRACT

Methods and apparatus of the present invention deposit fluorinated silicate glass (FSG) in such a manner that it strongly adheres to an overlying or underlying barrier layer or etch stop layer, and has a lower dielectric constant, among other benefits. In one embodiment, silicon tetrafluoride (SiF$_4$), oxygen (O$_2$), and argon (Ar) are used as the reactant gases, with the ratio of oxygen to silicon controlled to be at between about 2:1 to 6:1. Such O$_2$ levels help reduce the amount of degradation of ceramic chamber components otherwise caused by the elimination of silane from the process recipe.

13 Claims, 13 Drawing Sheets

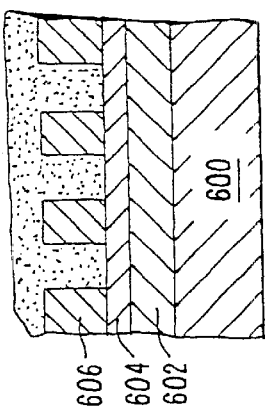
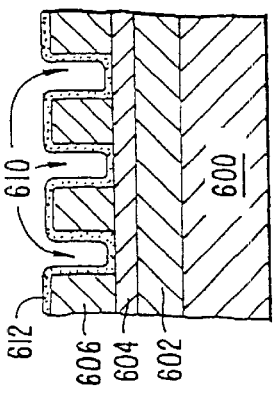
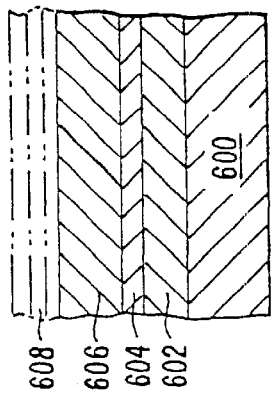
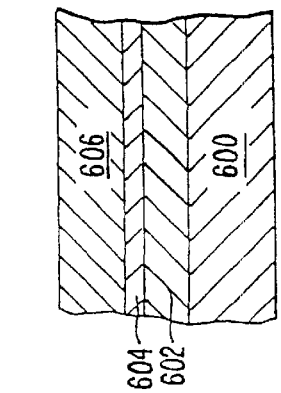
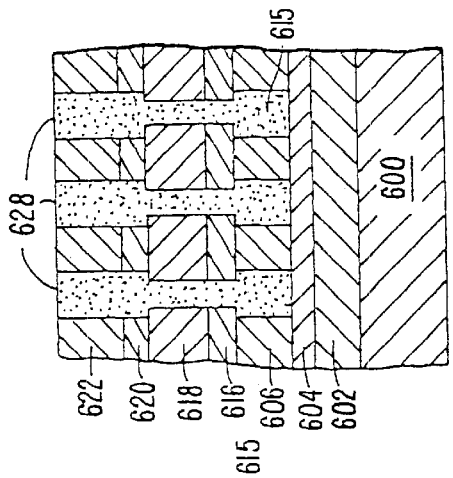
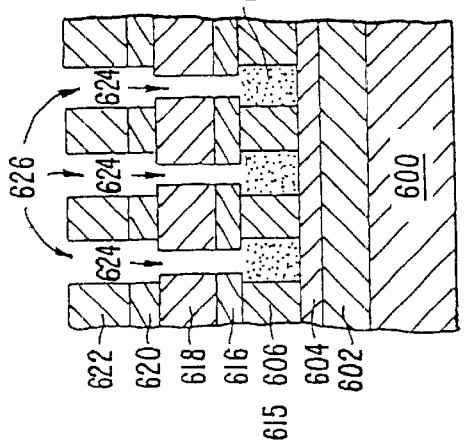
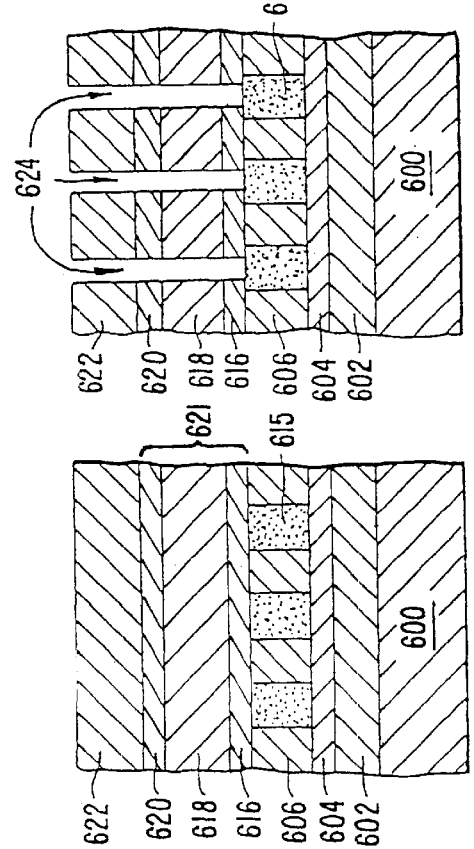

METHODS AND APPARATUS FOR PRODUCING STABLE LOW K FSG FILM FOR HDP-CVD

BACKGROUND OF THE INVENTION

The present invention relates to the manufacture of integrated circuits, and more specifically, to methods, apparatus and systems for forming fluorinated silicate glass ("FSG") films with improved characteristics in a high-density-plasma chemical-vapor-deposition ("HDP-CVD") environment.

In conventional integrated circuit fabrication, circuit elements are formed by etching a pattern of gaps in a layer of metal such as aluminum. The gaps are then filled with a dielectric such as silicon dioxide. Copper is poised to take over as the main on-chip conductor for all types of integrated circuits because of its lower resistance when compared to conventional aluminum alloys. Because it is difficult to etch copper, however, damascene processes have been developed for fabricating copper-based integrated circuits. In damascene processes, dielectric layers are deposited and then etched to form gaps that are subsequently filled with copper.

Fluorine-doped silicon oxide, also known as fluorosilicate glass, is an attractive solution to replace conventional silicon dioxide as intermetal dielectrics for damascene structures. FSG can be deposited in conventional HDP-CVD systems, which have been widely used for undoped silicate glass (USG) and FSG dielectrics in aluminum interconnects. FSG generally has a good process scheme in terms of reliability, stability, and throughput. Furthermore, the electrical performance of integrated circuits can be significantly improved due to the lower dielectric constant of FSG (3.4–3.7 compared to 4.1 for conventional silicon oxides). The lower dielectric constant reduces the capacitance between metal lines in the same layer and reduces cross talk across layers.

Unfortunately, the formation of FSG films raises other issues. First, blanket deposition of FSG films typically have a dielectric constant of about 3.7. It is desirable, in some instances, to further reduce this dielectric constant to improve device quality and performance.

Second, FSG layer integration problems have arisen as a result of the process recipe. Dielectric films used in damascene processes utilize a layer known as an etch stop to provide for selective etching of the film. Silicon nitride ($Si_xN_y$) is commonly used as an etch stop in damascene applications, for example when forming vias between layers containing metal lines. In the past, there have been problems in obtaining good adhesion between the silicon nitride and an underlying or overlying layer of FSG. Specifically, the FSG tends to outgas at temperatures of about 450° C. forming "bubbles" in an overlying $Si_xN_y$ layer. The bubbles lead to delamination of the $Si_xN_y$.

The presence of silane ($SiH_4$) during deposition incorporates some hydrogen into the FSG film as an impurity. It is not clear by what mechanism the presence of hydrogen in the FSG degrades the adhesion of the FSG to $Si_xN_y$. It is believed that the poor adhesion and consequent delamination are related to the increased diffusivity of hydrogen in FSG at temperatures of 400° C. or greater. Additional details on the effects of silane on FSG quality and adhesion are discussed in U.S. patent application Ser. No. 09/569,744, entitled "Method for Improving Barrier Layer Adhesion to HDP-FSG Thin Films," filed May 11, 2000, and assigned to Applied Materials, Inc., assignee of the present application, the complete disclosure of which is incorporated herein by reference.

Previous attempts to improve the adhesion by, for example, reducing the fluorine content in the FSG merely postpone the delamination. Similarly, other problems arise when, in an attempt to reduce the hydrogen content in the FSG film, the hydrogen source is reduced (e.g., the amount of silane is reduced). In some cases, FSG deposition using $SiF_4$ without $SiH_4$ has a lower deposition rate than FSG deposition with both $SiF_4$ and $SiH_4$. Furthermore, $SiF_4$ tends to be destructive to ceramic components of the chamber. Using $SiH_4$ with the $SiF_4$ tends to mitigate the destructive effects of $SiF_4$. Hence, reductions in silane result in increased degradation of chamber components.

When FSG films are deposited on a silicon nitride or Blok™ barrier layer in damascene or dual damascene applications, failure to integrate the FSG with the barrier layers poses a significant obstacle in the widespread acceptance of FSG as an adequate low-k dielectric material.

Therefore, a need exists in the art for a method of depositing an FSG film with improved integration and stability. Further, a need exists to further lower the dielectric constant in the FSG film.

SUMMARY OF THE INVENTION

The disadvantages associated with the prior art are overcome by methods, apparatus and systems of the present invention. For example, the invention provides methods of forming a damascene FSG film with improved film properties.

In one embodiment, a gaseous mixture consisting essentially of flows of a gas that contains both fluorine and silicon, a gas that contains oxygen, and an inert gas is provided to a process chamber. The inert gas is used to promote gas dissociation. In alternative embodiments, the gas that contains both fluorine and silicon is $SiF_4$, the gas that contains oxygen is $O_2$, and the inert gas is argon. It will be appreciated by those skilled in the art that other gas sources may be used within the scope of the present invention. A plasma, preferably a high-density plasma, is generated from the gaseous mixture, and an FSG layer is deposited on the substrate using the plasma. Removing the silane ($SiH_4$) from the deposition recipe results in less hydrogen incorporated into the film In one embodiment, the FSG layer is substantially free of hydrogen. As a result, integration with, and adhesion to overlying or underlying etch stop or barrier layers, such as silicon nitride, is improved.

In one embodiment, the method further comprises controlling the oxygen-to-silicon ratio of the gaseous mixture to be at least about 3.0:1. In other embodiments, the ratio is controlled to be between about 2.0:1 to about 6.0:1, between about 3.0:1 to about 6.0:1, and the like. Such amounts of oxygen are greatly increased from the 1.7:1 amounts previously used. In this manner, the increased oxygen partial pressure in the chamber helps mitigate degradation of the chamber components, such as the ceramic components. This is accomplished, at least in part, by at least partially suppressing the formation of $AlF_3$ on the ceramic ($Al_2O_3$) chamber components.

The methods of the present invention may be embodied in a computer-readable storage medium having a computer-readable program embodied therein for directing operation of a substrate processing system.

Further, the present invention provides a substrate processing system which includes a housing defining a process chamber, a plasma generation system, a substrate holder, a gas delivery system, a pressure control system, and a system controller. A memory coupled to the controller includes a computer-readable medium having a computer-readable program embodied therein. The program includes instructions for operating the substrate processing system to form a thin film on a substrate disposed in the processing chamber in accordance with the embodiments described above and below. In one embodiment, such instructions include instructions to control the gas delivery system to produce and/or maintain a gaseous mixture having an oxygen-to-silicon ratio that is at least about 3.0: 1, and in another embodiment is between about 3.0:1 and 6.0:1.

These and other embodiments of the present invention along with many of its advantages and features are described in more detail in conjunction with the text below and attached figures.

BRIEF DESCRIPTION OF THE DRAWINGS

FIG. 4(a) is a cross-sectional view of a dielectric thin film deposited according to the second embodiment of the method of the present invention;

FIGS. 6(a)–6(h) depict a cross section of a partially formed integrated circuit undergoing an integrated dual-damascene process according to an embodiment of the present invention;

DESCRIPTION OF THE SPECIFIC EMBODIMENTS

I. Introduction

The present invention deposits fluorinated silicate glass (FSG) in such a manner that it strongly adheres to an overlying or underlying barrier layer or etch stop layer, and has a lower dielectric constant, among other benefits. In the present method, silicon tetrafluoride ($SiF_4$), oxygen ($O_2$), and argon (Ar) are preferably used as the reactant gases. $SiF_4$, and $O_2$ react to form the FSG. Ar, or another inert or carrier gas, is included to promote gas dissociation. The material thus deposited is referred to herein alternatively as "$SiF_4$-only FSG" or "$SiF_4$ only fluorinated oxide" ("SOFO"). In some embodiments, the ratio of oxygen to silicon is controlled to be at least about 3.0:1, to be between about 2.0:1 and 6.0:1, to be between about 3.0:1 and 6.0:1, and the like. The use of increased oxygen levels helps reduce the amount of degradation of chamber components otherwise caused by the elimination of silane from the process recipe.

II. Exemplary Substrate Processing System

Figure 1A:
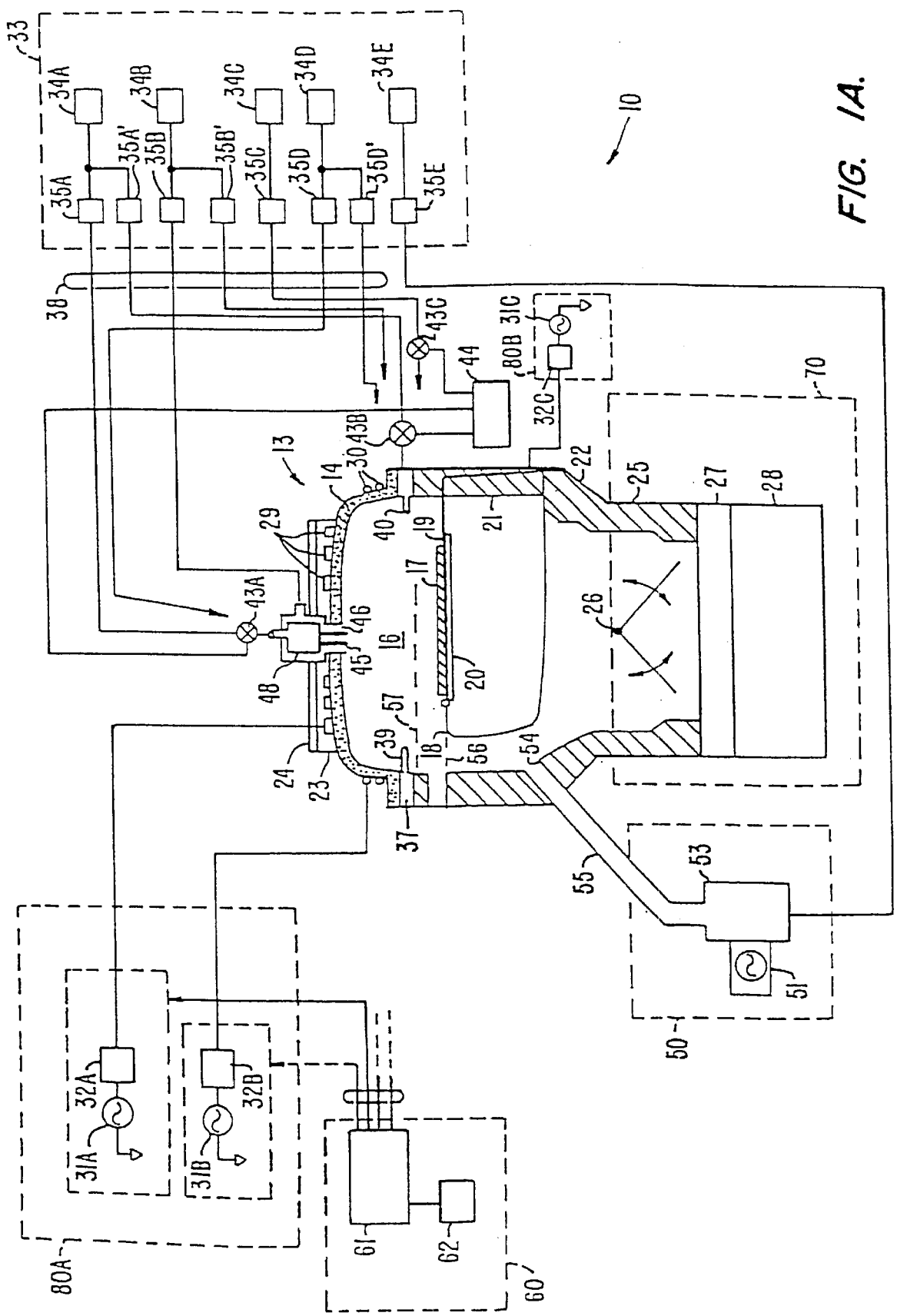
FIG. 1A is a simplified diagram of one embodiment of a high-density plasma chemical vapor deposition system according to the present invention.

FIG. 1A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses a twin-blade or three blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 31A provides up to 8,000 watts of RF power at nominally 2 MHz and the side source RF generator 31B provides up to 8,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system SOB includes a bias RF ("BRF") generator 31C and a bias matching network 32C. The bias plasma system SOB capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 8,000 watts of RF power at 13.56 MHz.

RF generators 31A and 31B include digitally-controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 31A and 31B with the irrespective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 1B:
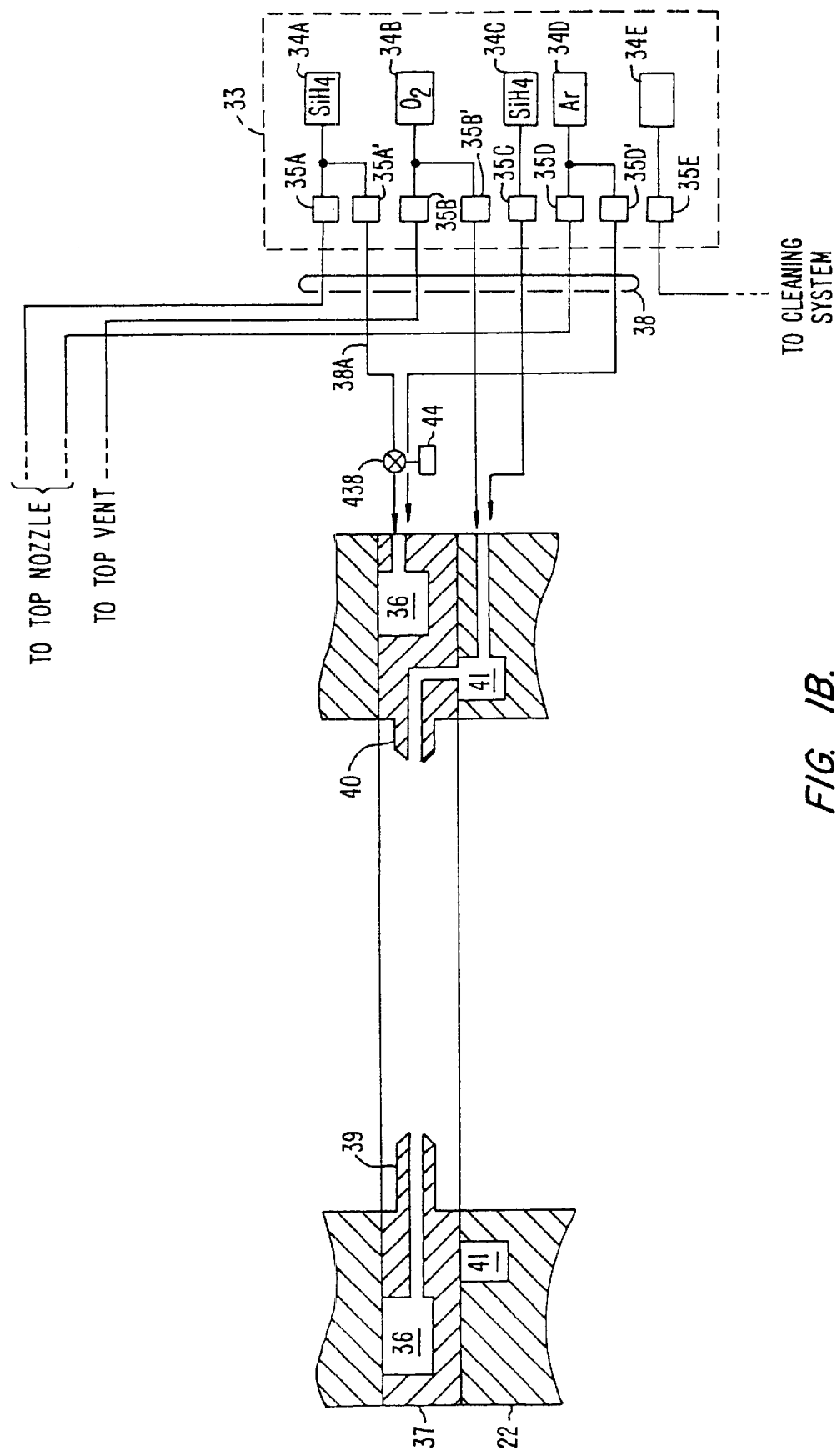
FIG. 1B is a simplified cross section of a gas ring that may be used in conjunction with the exemplary CVD processing chamber of FIG. 1A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 1B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in one embodiment receive gas from body plenum 41. In one embodiment nozzles 40 are co-planar with and shorter than source gas nozzles 39, and in another embodiment are about the same length as nozzles 39. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. The nitrogen source 34F provides nitrogen gas ($N_2$) to the oxidizer nozzles of the gas ring to the chamber for process steps utilizing nitrogen plasma. Alternatively, the nitrogen gas could be delivered to the chamber through other or additional inlets, such as the top nozzle. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 1A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

Figure 1C:
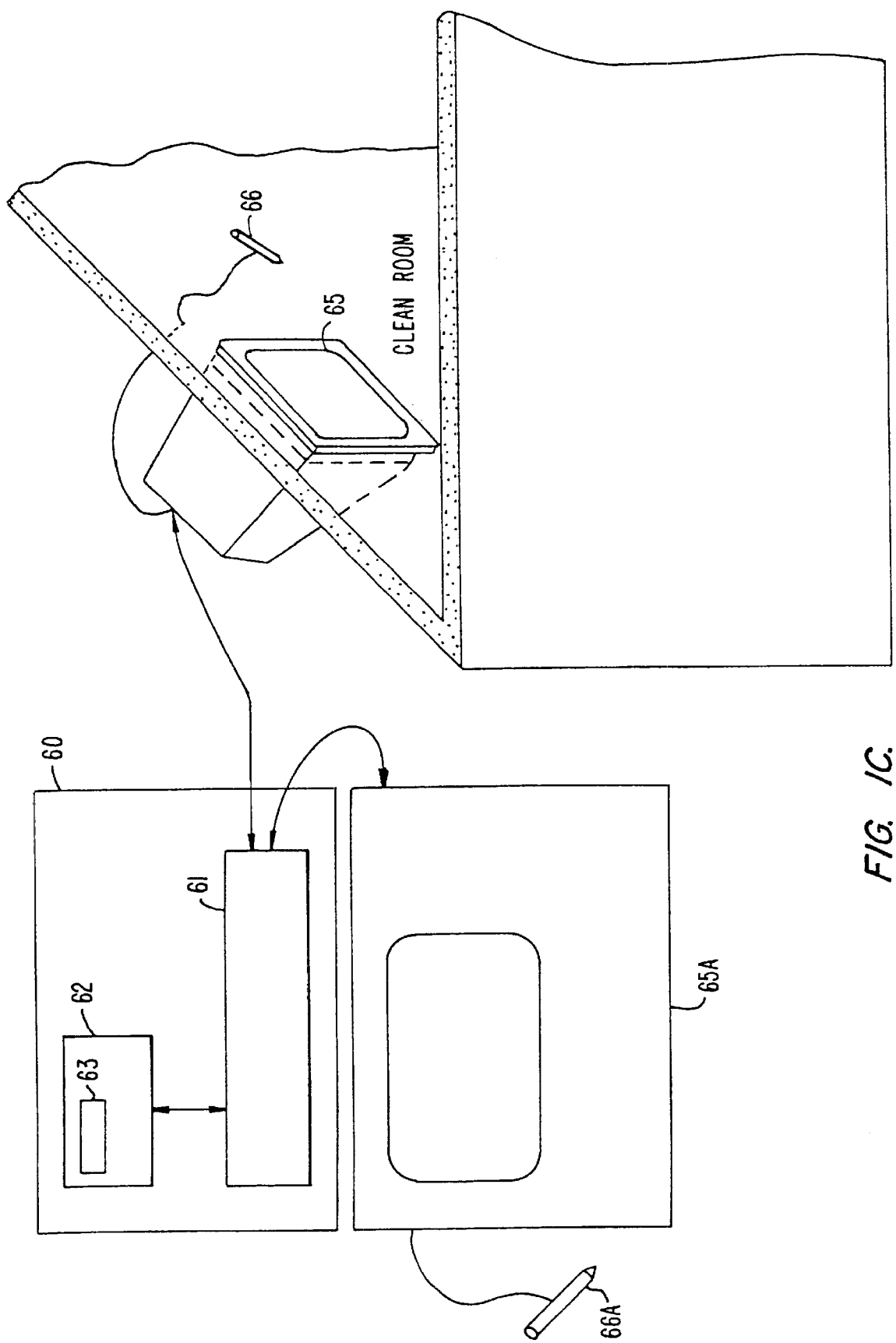
FIG. 1C is a simplified diagram of a monitor and light pen that may be used in conjunction with the exemplary CVD processing chamber of FIG. 1A.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 1C. Alternatively, a TFT touch screen is used.

FIG. 1C is an illustration of a portion of an exemplary system user interface used in conjunction with the exemplary CVD processing chamber of FIG. 1A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 1D:
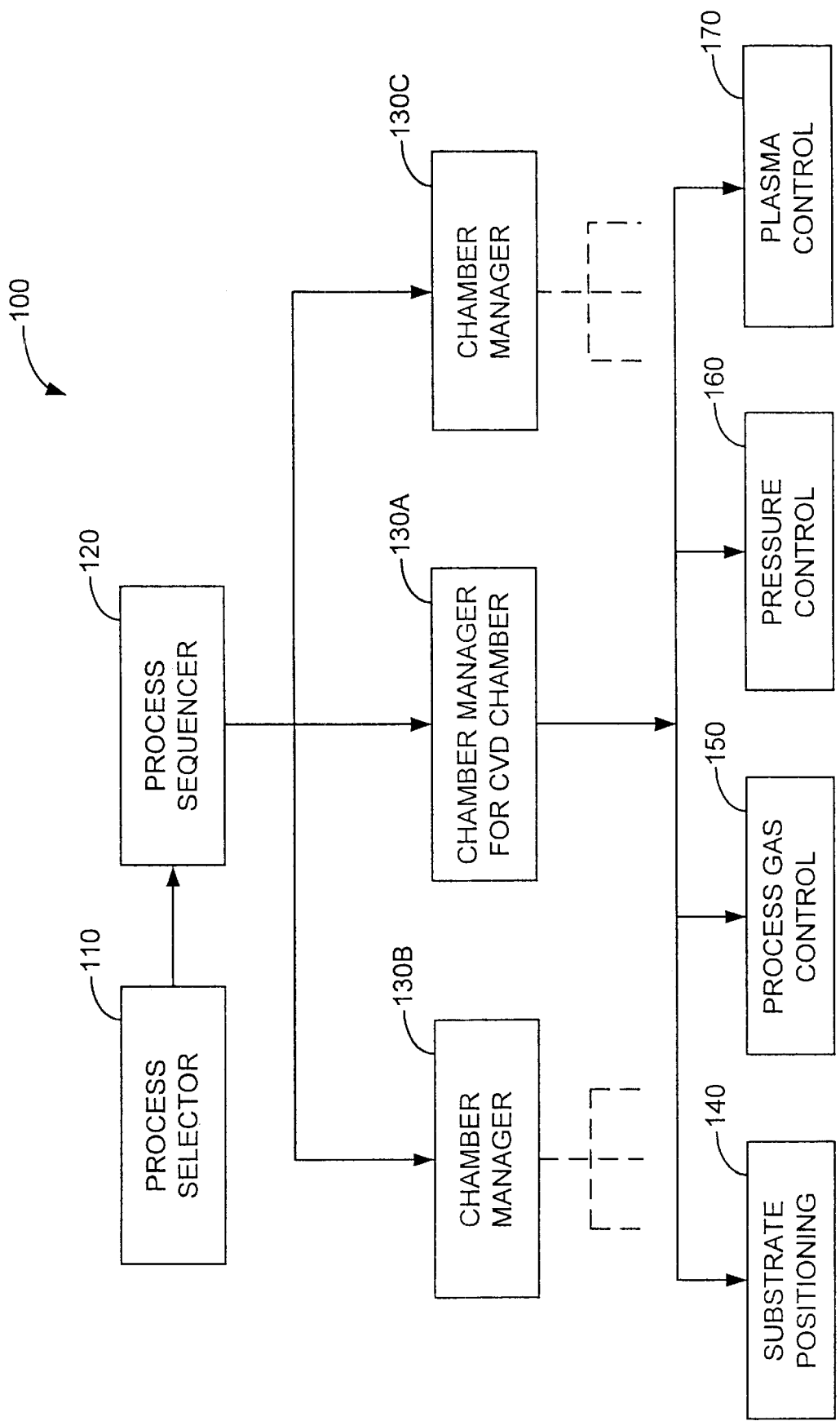
FIG. 1D is a flow chart of an exemplary process control computer program product used to control the exemplary CVD processing chamber of FIG. 1A.

FIG. 1D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 340, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1A and 1D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multichamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the copending, commonly assigned U.S. patent application No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

III. Exemplary FSG Depostion

Figure 2:
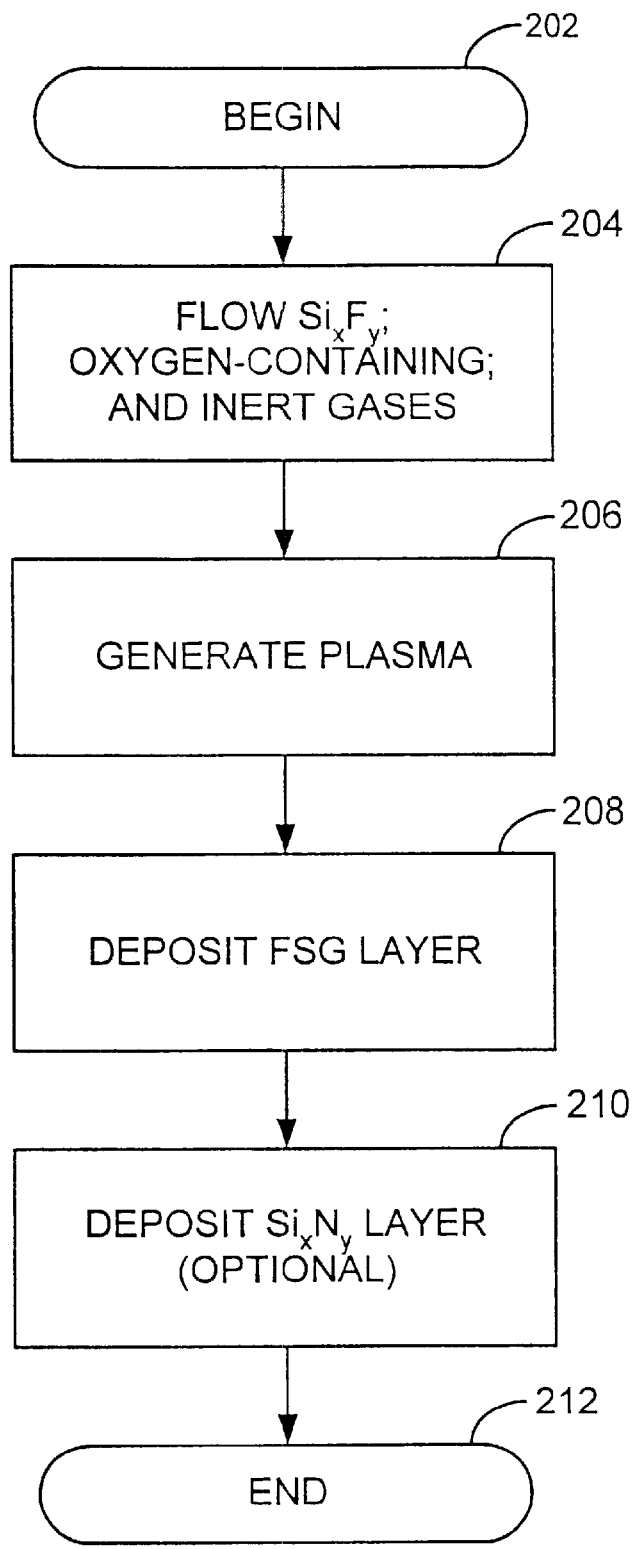
FIG. 2 is a flow diagram of a first embodiment of the method of the present invention.
Figure 3:
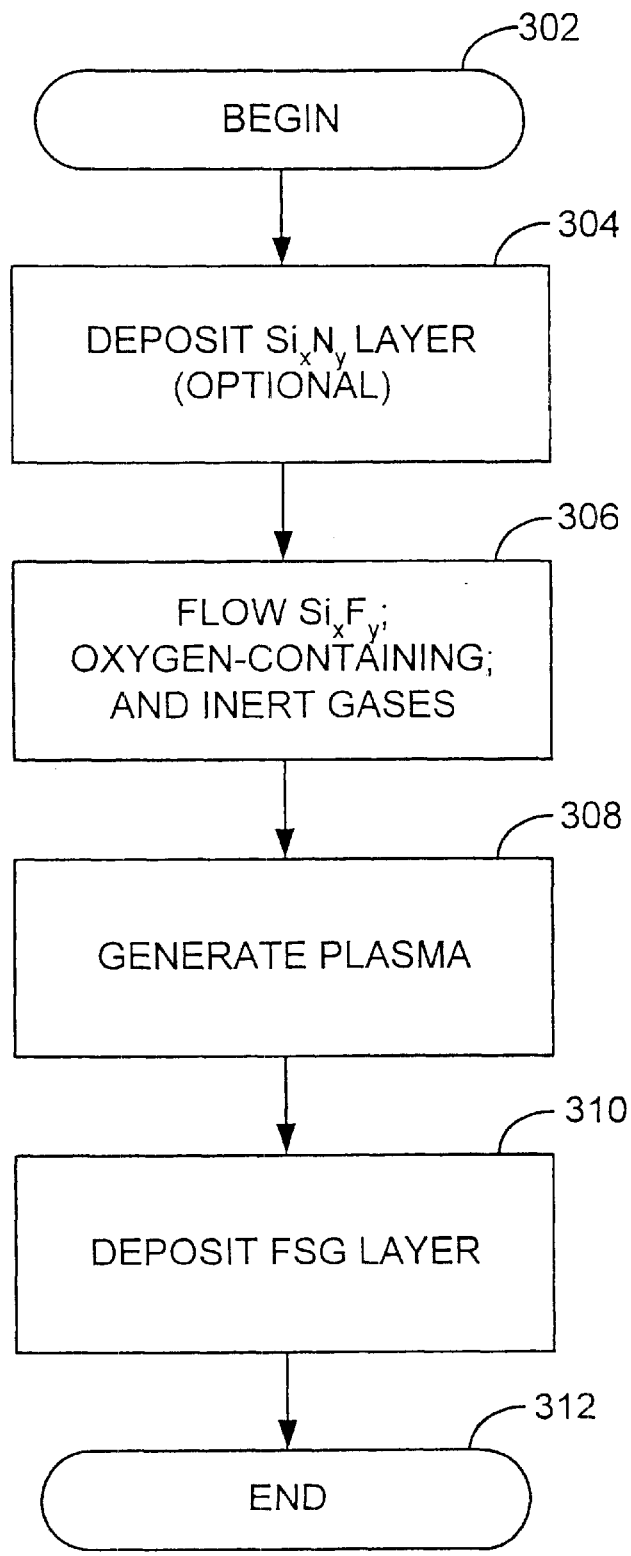
FIG. 3 is flow diagram of a second embodiment of the method of the present invention.
Figure 4A:
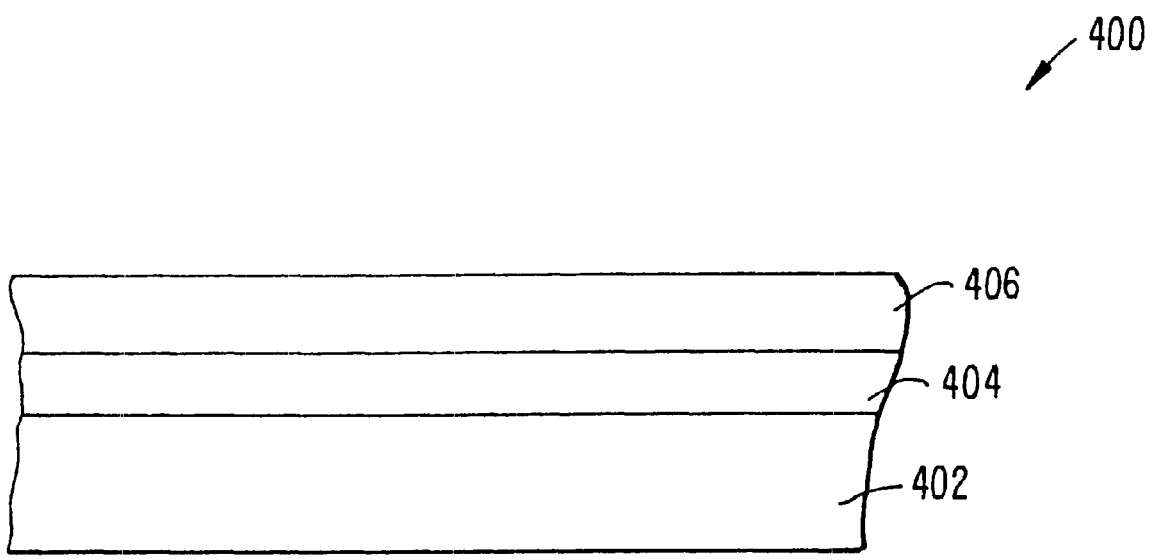
FIG. 4(a) is a cross-sectional view of a dielectric thin film deposited according to the first embodiment of the method of the present invention.
Figure 4B:
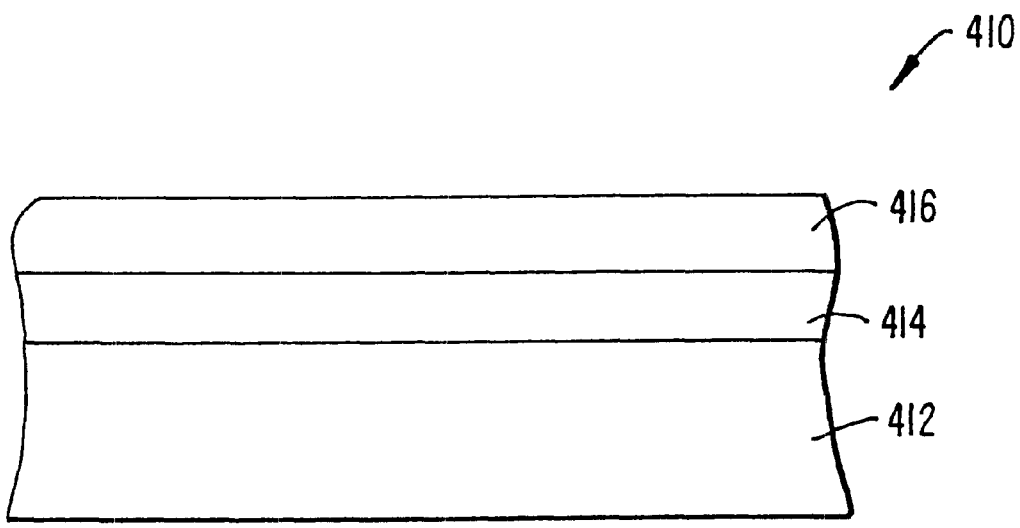

The present invention improves adhesion of HDP-FSG to overlying or underlying silicon nitride ($Si_xN_y$). The method is best understood with reference to 2, 3, 4(a) and 4(b). FIGS. 2 and 3 depict embodiments of the method of the present invention. FIGS. 4(a) and 4(b) represent portions of a device 400 and 410 having dielectric films deposited using the embodiments of FIGS. 2 and 3, respectively.

The first embodiment of the method is best understood by simultaneously referring to FIGS. 2 and 4(a). FIG. 2 depicts a flow diagram for depositing an FSG film 404 having improved adhesion to a subsequently deposited overlying $Si_xN_y$ layer 406. The method 200 begins at Step 202. At Step 204 a gaseous mixture containing flows of $Si_xF_y$, an oxygen-containing gas and an inert gas is introduced to a process chamber, such as chamber 13. In one embodiment, chamber 13 contains at least some ceramic ($Al_2O_3$) components. In one particular embodiment, the gas mixture contains flows of $SiF_4$, $O_2$, and Ar. Flow rates for the deposition gases range from about 50 to 150 standard cubic centimeters per minute (sccm) for $SiF_4$, from about 200 to 550 sccm for $O_2$, and from about 100 to 400 sccm for Ar. The chamber pressure is typically maintained at between about 3 and 10 millitorr. The chamber wall temperature is typically maintained at between about 60° C. and 170° C., and in one embodiment is about 75° C. Other flow rates, temperature ranges and pressure ranges also may be used.

The gaseous mixture is energized at Step 206 to form a plasma for depositing FSG 404 on a substrate 402, such as a silicon substrate. Preferably, the plasma is a high density plasma (HDP), i.e. a plasma having an ion density of approximately $10^{11}/cm^3$ or greater. Bias power is not normally used in the deposition process. Usually, only source RF power is used for plasma generation and deposition and substrate temperature control. For example, in an HDP chamber such as chamber 13, between 1500 and 8000 watts of RF power are applied to top coil 29 and between 3000 and 8000 watts are applied to side coil 30.

The substrate temperature is typically maintained at between about 400° C. and about 450° C. during FSG deposition. Generally, the substrate is heated with the plasma using source RF power only. Sometimes, a low bias RF power (i.e., up to 500 watts) can be used for deposition temperature control using a closed loop with backside emissivity wafer temperature control. For example, a low bias power (up to 400 W for 200 mm wafers or ~1.3 W/cm²) is sometimes used to heat-up epitaxial silicon (epi) wafers to the desired temperature during the process. Because of their very low resistivity, epi wafers cannot be heated with only source RF and a bias RF is necessary to help in heating up the wafer to the desired temperature. In addition, back side He cooling may optionally be used for process temperature control and targeting.

After FSG film 404 has been deposited to a desired thickness, optional Step 210 provides that a layer of $Si_xN_y$ 406 is deposited on top of the FSG layer 404. $Si_xN_y$ layer 406 can be deposited by any conventional means including PECVD and HDP-CVD. However, from a standpoint of process integration, it is more convenient to deposit the $Si_xN_y$ in the same chamber as the FSG deposition. Thus, if, for example, the FSG layer is deposited in an HDP-CVD chamber, it is convenient to deposit the $Si_xN_y$ layer by HDP-CVD in the same chamber. The $Si_xN_y$ can be deposited on top of the FSG to any desired thickness, but adhesion generally worsens as the $Si_xN_y$ thickness increases. Good adhesion can be obtained for $Si_xN_y$ having a thickness of about 500 Å.

By removing silane ($SiH_4$) from the gaseous mixture or process recipe, less hydrogen is available to be incorporated into the interfacial portion of the FSG film, that is, the FSG film portion adjacent the $Si_xN_y$ layer. In one embodiment, the FSG film is substantially free of hydrogen. Further, FSG films deposited according to methods of the present invention have improved dielectric constants. In one embodiment, the FSG layer has a dielectric constant that is between about 3.3 and 3.7. In alternative embodiments, the dielectric constant is about 3.4, is about 3.3, or is less than 3.3.

As noted above, however, elimination of silane from the gaseous mixture results in additional problems, notably, the degradation of ceramic chamber components due to the fluorine content in the gaseous mixture. Silane-free gaseous mixtures used for forming FSG films react according to the simplified reaction (1):

$$SiF_4 + O_2 \rightarrow SiOF + F \qquad (1)$$

The free fluorine in chamber 13 has an etch capability that reacts with the season layer and other parts of chamber 13. Reaction with the ceramic dome 14 forms $AlF_3$, causing a blackening of dome 14. The simplified reaction (2) for dome blackening is:

$$Al_2O_3 + 3F_2(g) \rightarrow 2AlF_3 + 3/2 O_2(g) \qquad (2)$$

Previous efforts on developing a $SiF_4$ only FSG process were unsuccessful as it resulted in blackening of the dome due to the attack from free fluorine. To counteract these effects, the inventors discovered that the gaseous mixture should include an oxygen content that is at a much higher level than currently used or previously tried. In one embodiment, the oxygen to silicon (O:Si) ratio for the present invention is between about 2:1 and about 6:1, and more preferably between about 3:1 and about 6:1. Such amounts of oxygen are greatly increased from the 1.7:1 (O:Si) ratio previously used. As a result of the increased oxygen partial pressure, the formation of fluorides (e.g., $AlF_3$) on ceramic (e.g., $Al_2O_3$) components is suppressed. The beneficial effect of increased oxygen content can be understood by reference to the simplified equation (3):

$$kp \propto 1/(P_{O_2})^{3/2} \qquad (3)$$

An increase in oxygen partial pressure results in a suppression of the reaction of $Al_2O_3$ to $AlF_3$. By suppressing the formation of fluorides, ceramic chamber components are subject to less degradation.

FIGS. 3 and 4(b) depict another embodiment of the method of the present invention wherein an FSG layer 416 is deposited on a substrate 412 over a layer of $Si_xN_y$ 414. The method 300 begins at Step 302. $Si_xN_y$ 414 layer is optionally deposited on the substrate 412 to a desired thickness (Step 304). As in the earlier-described embodiment, $Si_xN_y$ layer 414 may be deposited by conventional means including HDP-CVD and PECVD. Furthermore, substrate 412 may be a silicon substrate 412.

After depositing $Si_xN_y$ layer 414, a gaseous mixture containing flows of $Si_xF_y$, an oxygen-containing gas and one or more inert gases, but not $SiH_4$, is introduced to process chamber 13 containing substrate 412 (Step 306). In one embodiment, the gaseous mixture contains flows of $SiF_4$, $O_2$, and Ar, although other source gases may be used. Flow rates for the deposition gases range from about 50 to 150 sccm for $SiF_4$, from about 200 to 550 sccm for $O_2$, and from about 100 to 400 sccm for Ar. As in the first embodiment, it may be desirable, from a process integration standpoint, to deposit both $Si_xN_y$ layer 414 and FSG layer 416 in the same chamber.

In one embodiment of the invention, the oxygen content of the gaseous mixture is controlled so that the oxygen to silicon ratio is at least about 3.0:1. In other embodiments, the O:Si ratio is controlled to be between about 3.0:1 to about 6.0:1, or between about 2.0:1 to about 6.0:1. Benefits of the increased oxygen content, and increased oxygen partial pressure, are described above.

The gaseous mixture is energized (Step 308) to form a plasma for depositing FSG layer 416 (Step 310). Preferably, the plasma is a high-density plasma (HDP). FSG film 416 is then deposited to a desired thickness using $SiF_4$, $O_2$, and Ar. Source RF power, bias RF power, chamber pressure, chamber temperature, and substrate temperature are generally maintained within the ranges set forth above with respect to the first embodiment. Without the $SiH_4$, essentially no hydrogen is available to be incorporated into FSG film 416. In one embodiment the FSG film thickness is about 10,000 Å. However, it will be appreciated by those skilled in the art that the thickness of FSG fill 416 will depend, in part, on the circuit structure being formed. The process ends at Step 312.

IV. Exemplary Structures

Figure 5:
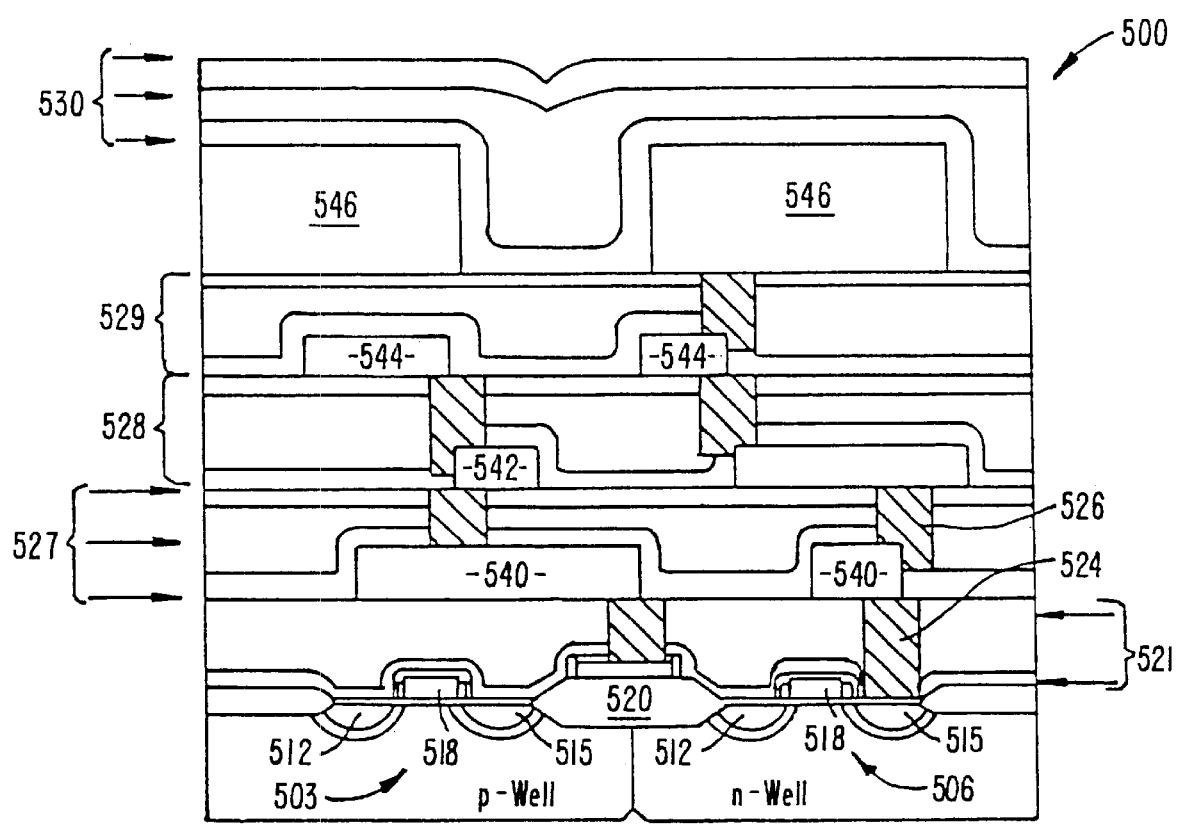
FIG. 5 shows a simplified cross-sectional view of a semiconductor device manufactured according to the method of the present invention.

FIG. 5 illustrates a simplified cross-sectional view of an integrated circuit 500, which may be made in accordance with use of the present invention. As shown, integrated circuit 500 includes NMOS and PMOS transistors 503 and 506, which are separated and electrically isolated from each other by a field oxide region 520 formed by local oxidation of silicon ("LOCOS"), or other technique. Alternatively, transistors 503 and 506 may be separated and electrically isolated from each other by a groove trench isolation (not shown) when transistors 503 and 506 are both NMOS or both PMOS. Each transistor 503 and 506 comprises a source region 512, a drain region 515 and a gate region 518.

A premetal dielectric (PMD) layer 521 separates transistors 503 and 506 from metal layer 540 with connections between metal layer 540 and the transistors made by contacts 524. Metal layer 540 is one of four metal layers, 540, 542, 544, and 546, included in integrated circuit 500. Each metal layer 540, 542, 544, and 546 is separated from adjacent metal layers by respective intermetal dielectric (IMD) layers 527, 528, or 529. Any or all of IMD layers 527, 528, or 529 can be deposited in accordance with embodiments of the present invention. Adjacent metal layers are connected at selected openings by vias 526. Deposited over metal layer 546 are planarized passivation layers 530.

It should be understood that simplified integrated circuit 500 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

V. Exemplary Damascene Process

An example of a dual-damascene process integration scheme that uses the SOFO layer deposition of the present invention in forming an IMD layer is depicted in FIGS. 6(a)–6(h). The dual damascene process begins with the deposition of an oxide layer 602 over a silicon substrate 600 as shown in FIG. 6(a). A barrier layer 604 is deposited over oxide layer 602, e.g., by HDP-CVD using $SiH_4$ and $N_2$ or PECVD using $SiH_4+NH_3/N_2$. In some applications layer 604 acts as a hardmask or etch-stop layer. A first SOFO layer 606 is deposited, e.g., using the HDP-CVD method described above. First SOFO layer 606 may be deposited in the same chamber as barrier layer 604 to enhance process integration. A first patterned photoresist layer 608 covers SOFO layer 606 during a first photolithography as shown in FIG. 6(b). A first etch forms a first set of gaps 610 in first SOFO layer 606 down to hardmask layer 604 as shown in FIG. 6(c).

After the first etch, photoresist 608 is stripped, e.g., by ashing in an oxidizing environment. Gaps 610 and first SOFO layer 606 are then covered with a layer of metal, such as aluminum or copper. In the case of copper, a seed layer 612 (FIG. 6(c)) is deposited over gaps 610 and first SOFO layer 606. A first bulk copper layer 614 is deposited to fill the gaps 610 as shown in FIG. 6(d). In some applications, a barrier layer (not shown) is deposited over first SOFO layer 606 and gaps 610 prior to deposition of seed layer 612. The barrier layer prevents interdiffusion of copper and SOFO. Copper layer 614 is planarized, e.g., by chemical and mechanical polishing (CMP). Planarization of copper layer 614 forms, e.g., a first set of metal lines 615 in an interconnect structure.

After planarization, of copper layer 614, a second barrier layer 616, a second SOFO layer 618, a third barrier layer 620 and third SOFO layer 622 are deposited to form an IMD layer 621 as shown in FIG. 6(e). Second SOFO layer 618 and third SOFO layer 622 may be deposited by HDP-CVD as described above. Layers 618, 620, and 622 may be deposited in the same chamber, e.g., by HDP-CVD, without removing substrate 600 to enhance process integration for forming IMD layer 621. To prevent oxidation of copper layer 620 and contamination of the chamber, substrate 600 may be heated in a high-density argon plasma without oxygen prior to depositing second FSG layer 618. A second lithography and etch forms vias 624 through layers 616, 618, 620 and 622 down to copper layer 614 as shown in FIG. 6(f). In FIG. 6(g), a third lithography and etch forms a second set of gaps 626. Gaps 626 define a second set of metal lines and vias 624 define a set of interconnects between the second set of metal lines and the first set of metal lines defined by gaps 610 and copper layer 614. Vias 624 and gaps 626 are then filled with a second bulk copper layer and the resulting structure is annealed and planarized as shown in FIG. 6(h). Gaps 626 define a second set of metal lines 628 and vias 624 define a set of interconnects 625 between the second set of metal lines 628 and the first set of metal lines 615.

Damascene processes are used in devices that use copper interconnects because of inherent difficulties in etching copper. Structures formed by damascene processes do not require a gap-fill dielectric and generally provide lower RC delays than similar structures formed using metal lines aluminum, tungsten, titanium or other metals. Furthermore, higher deposition rates may be used in damascene processes since gap-fill is not an issue. Any of barrier layers 606, 616 and 620 can be silicon nitride layers. Furthermore, it may also be alternatively desirable to deposit one or more of barrier layers 606, 616 and 620 as silicon-carbon low-k barrier layers such as BLOK™ (Barrier Low K). BLOK™ is a trademark of Applied Materials, Inc. of Santa Clara, Calif.

VI. Experimental Results

Experimental results have demonstrated that it is possible to achieve good adhesion between FSG films and barrier layers such as silicon nitride using the methods of the present invention. Furthermore, the dielectric constant of SOFO films is found to be reduced when compared with FSG films, making them preferable over SiH4-FSG films in many applications.

In testing performed by the inventors, process parameters including RF powers, gas flows and gas ratios were varied to arrive at a desired film. To select a film having the desired properties, the inventors ran design of experiments (DOEs) for the FSG films. As noted above, in one embodiment a flow rate for $SiF_4$ ranging from about 20 sccm to about 200 sccm, a flow rate for $O_2$ ranging from about 100 sccm to about 700 sccm, and a flow rate for Ar ranging from about 20 sccm to about 600 sccm were used. The tests focused on $O_2$:Si ratios that were greater than 2:1, and in other cases between about 2:1 and 6:1. Two (2) sets of SOFO films were deposited for testing on 300 mm wafers. Also deposited were two (2) sets of films using silane in the gaseous mixture for comparison of film characteristics.

Once the films were produced, Intel FSG Benchmarking Tests were used as the standard to evaluate the production worthiness of the films. The films were characterized by measuring the thickness, uniformity, refractive index (RI), fluorine concentration and uniformity. Fluorine stability was measured using Fourier-transform infrared (FTIR) transmission spectroscopy and thermal desorption analysis (TDS). The k value was measured using the Mercury probe, which uses a drop of mercury to act as an electrode probe to measure dielectric constant, k. Integration behavior was evaluated by depositing 2000 Å of PE CVD nitride layer, and annealing these films in an nitrogen ($N_2$) ambient for 2 hours at 500° C. The films were then inspected for any bubbling or cracking. The same tests were conducted on the second set of wafers after etching them in an HF bath to remove 2000 Å of the film.

Regarding film uniformity, which is the standard deviation in film thickness across the wafer divided by the average film thickness across the wafer and expressed as a percentage, tests showed that the film uniformity improved with source power. In one preferred embodiment, uniformity was around 2.7% for a 4,000/7,000 W (top/side) power. The films were center thin. The film uniformity, however, could be improved by having the capability to flow $SiF_4$ through the top nozzle. This is now possible with the incorporation of top $SiF_4$ flow in the Applied Materials ULTIMA HDP-CVD reactor. The overall deposition rate of the $SiF_4$ only film was about the same(~7,400 Å/minute) as the $SiH_4$ based FSG.

Higher source power films than indicated above tended to result in the evolution of compounds of Fluorine, such as $F_2$, $SiF_3$, and $SiF_4$, at temperatures slightly above 400° C. In addition, the higher source power films absorbed moisture. Higher deposition pressure from these conditions also worsened the uniformity. Hence, in one embodiment, film deposition occurs in a region of reduced source power.

The influence of bias RF power was also studied. Although high source power in general improves the uniformity, the inventors discovered that the introduction of bias power can be detrimental to the film uniformity. The bias power also results in unstable fluorine and fluorine compounds.

Additional experiments were conducted to test other film properties, such as the k value, the stability of the fluorine and the integration with PE CVD low deposition rate nitride film (LDR NIT). These experiments were in accordance with the FSG Benchmarking tests conducted by Applied Materials HDP-CVD and PE CVD product groups on their respective FSG films. Characteristics studied include the concentration and stability of the fluorine (FTIR and TDS), k value, wet etch rate ratio (WERR) of the $SiH_4$-based and the SOFO FSG films as deposited and after wet etch to ensure that fluorine was stable and therefore the k value.

Figure 7A:
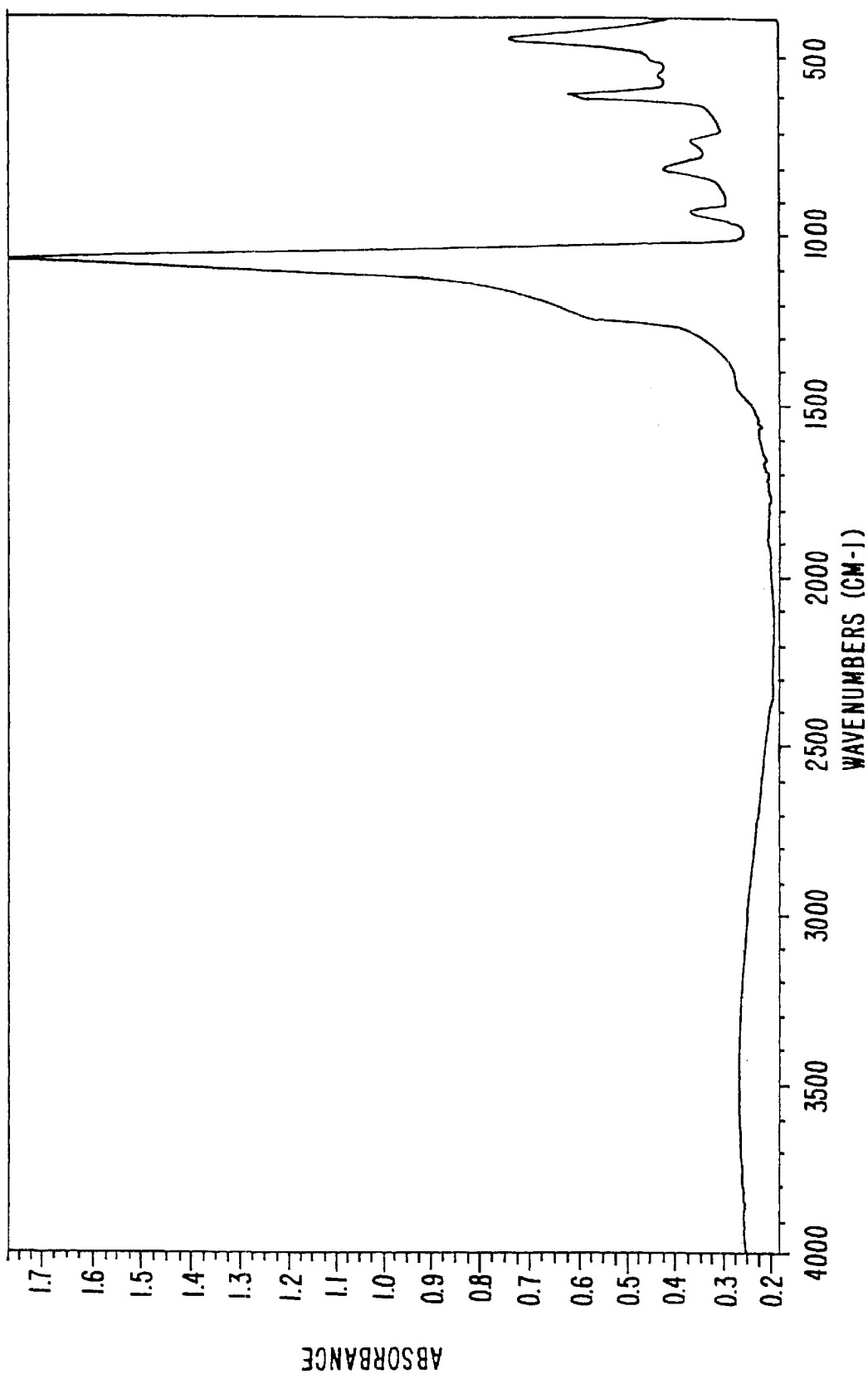
FIGS. 7A and 7B depict post wet etch spectra of $SiH_4$ and $SiF_4$ only FSG, respectively.
Figure 7B:
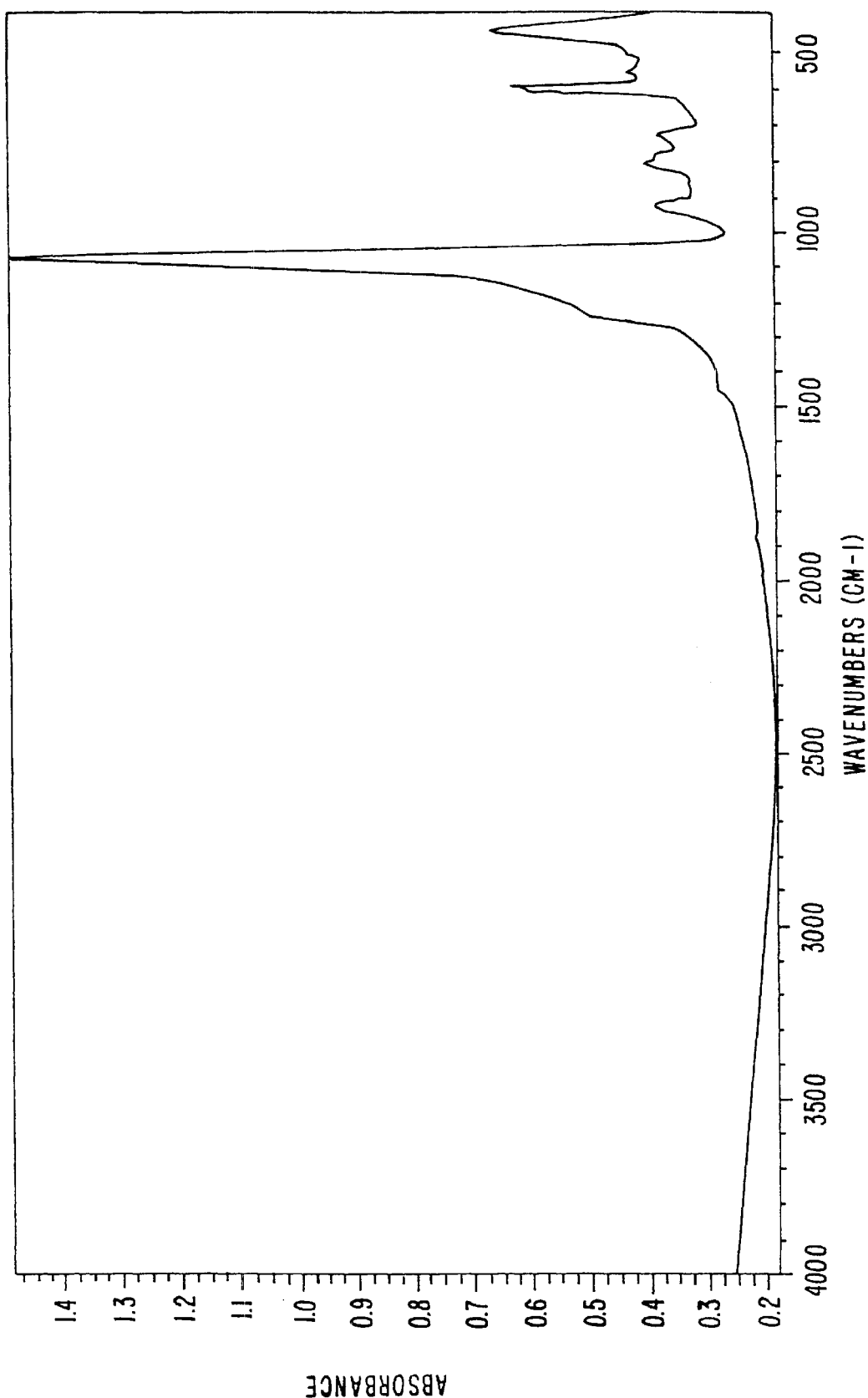

FTIR spectra for post wet etch of $SiH_4$-based and SOFO FSG films are shown in FIGS. 7A and 7B, respectively. FTIR measures fluorine bonded to silicon rather than all of the fluorine in the film. To determine the fluorine concentration, the height of the Si—F stretching peak at 1090 cm$^{-1}$ was divided by the height of the Si—O peak at 937 cm$^{-1}$. This ratio, termed the peak-height ratio ("PHR"), was used to quantify the fluorine concentration.

FTIR spectra show no trace of $SiF_2$ peak, which is the unstable form of fluorine in FSG. The presence of $SiF_2$ greater than about 2% by PHR results in the instability of fluorine in the FSG. The target fluorine concentration in the film is 6% as measured from a peak height ratio of the Si—F peak to the Si—O peak. The FTIR spectra shown are for FSG films etched in an HF bath to remove 2000 Å from the original deposited film. The fluorine concentration remains the same before and after the wet etch, confirming the presence of stable fluorine in the film. From a 9-point FTIR measurement, the distribution of fluorine in the SOFO film is more uniform (~1.5%) than in the $SiH_4$ based FSG (~2.5%). $SiH_4$ is easier to break than $SiF_4$ and the H atoms bond with Si—O bond to form Si—O—H. For the $SiF_4$ only film, increasing the $_2$:Si ratio helps in better fluorine distribution through the film.

Figure 8A:
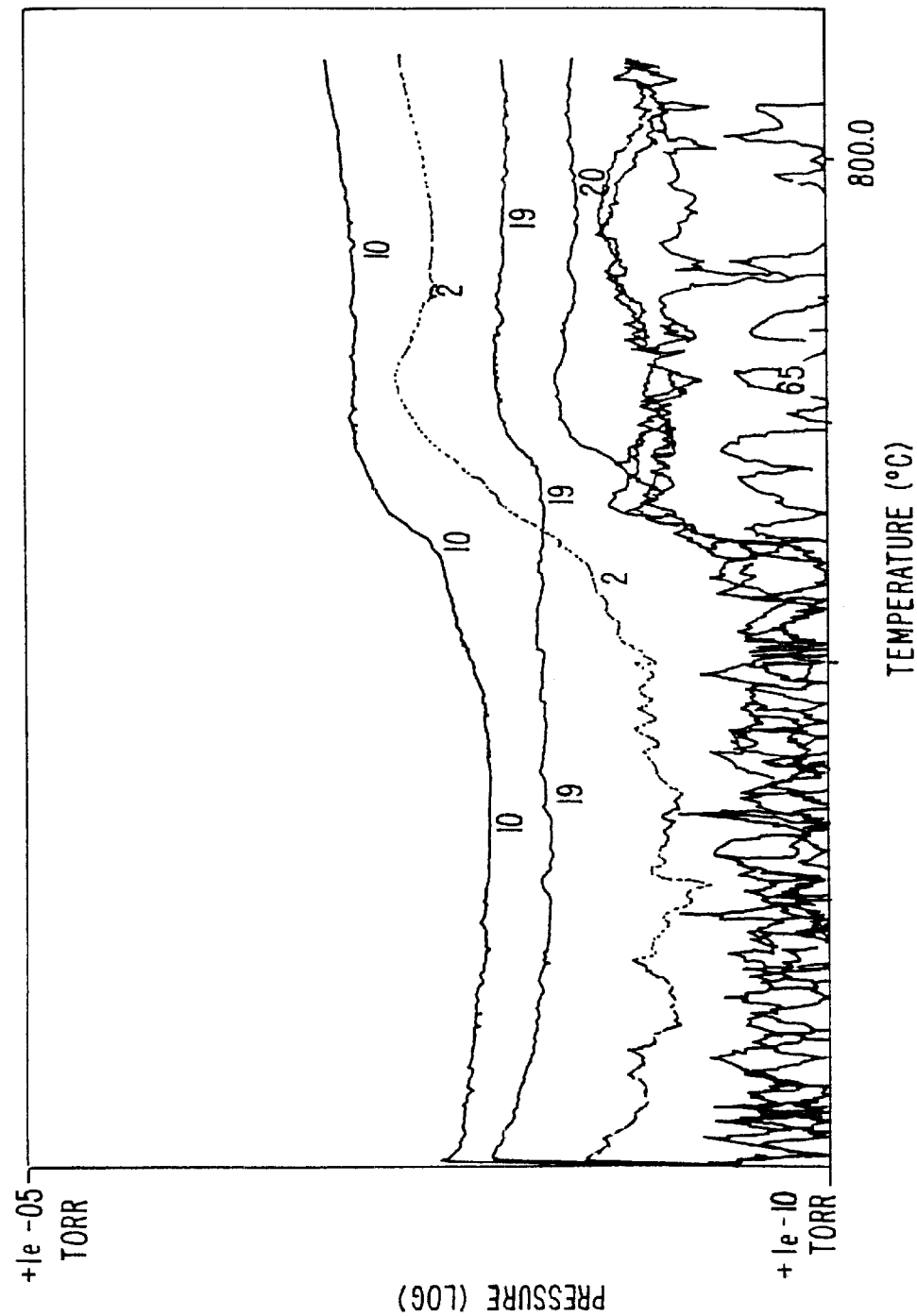
FIGS. 8A and 8B depict pre-etch and post-etch TDS for $SiF_4$ only FSG film, repectively.
Figure 8B:
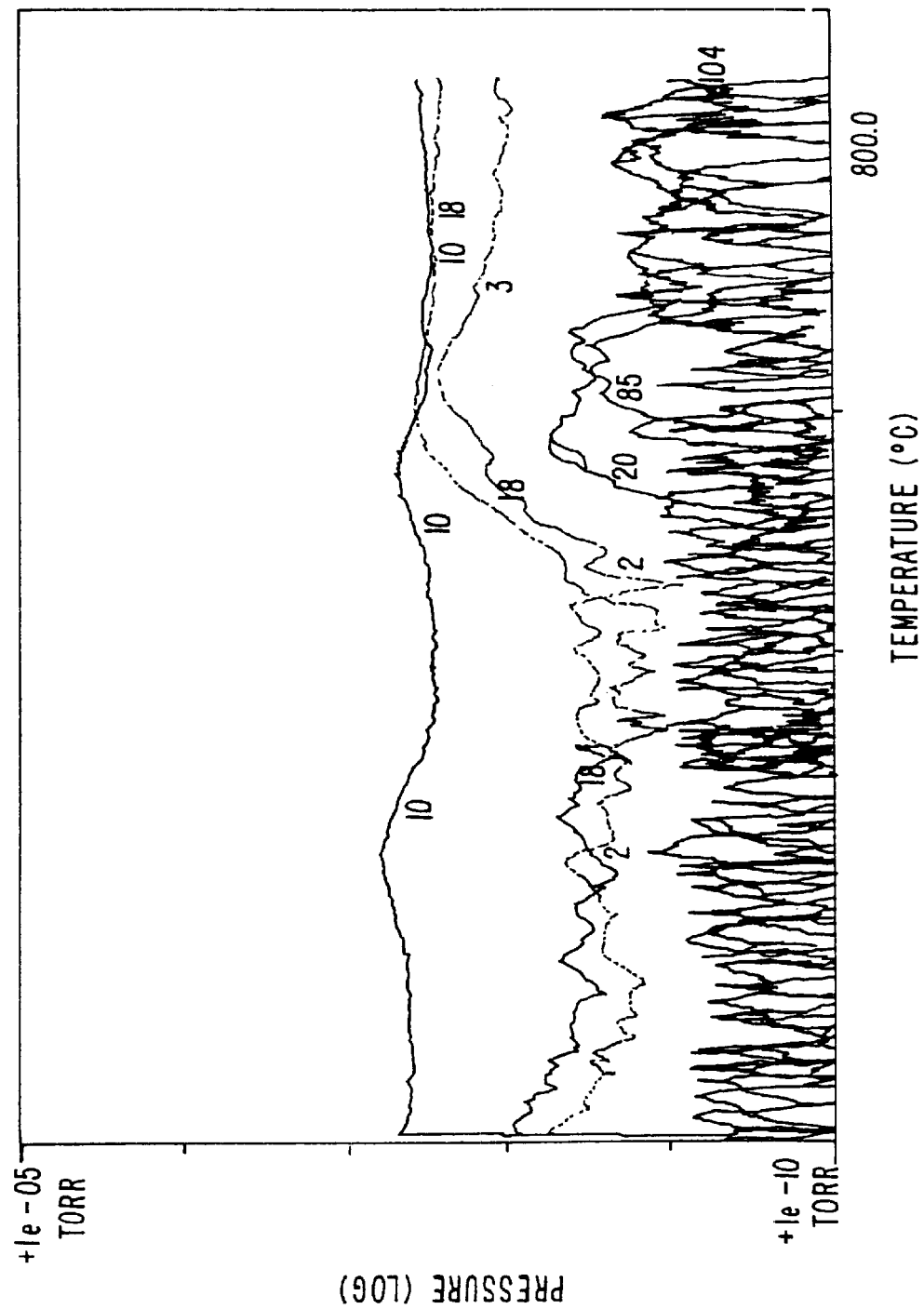

The k value was measured using the mercury probe. The k value of the $SiH_4$ based FSG was 3.65 and that of the $SiF_4$ only film was about 3.4. The k value measured after the wet etch remained the same as before for both the films. Both of the above results corroborate the stability of the fluorine and the film in general. To ensure a very stable film, the FSG film was subjected to thermal desorption analysis (TDS), which is the most rigorous test of the stability of the fluorine. FIGS. 8A and 8B show the TDS spectra before (FIG. 8A) and after (FIG. 8B) the wet etch. The pre-etch TDS shows the evolution of free fluorine at temperature above 550° C. and hydrogen at a temperature above 500° C. The hydrogen evolution temperature remains the same. However, integration of the film in the process flow typically occurs at a thermal budget of 450° C., so this problem is avoided.

Film integration was studied according to the FSG Benchmarking techniques outlined. The experiment involved deposition of a 2000 Å PE CVD nitride layer on top of the FSG film and annealing the film for two (2) hours in a furnace at 500° C. After the two hour anneal, the film was then inspected under microscope for any bubbling. For the processes outlined above, no bubbling was observed. There was no outgassing of fluorine from the FSG film. An etch back step was performed on the original film, which etched 2000 Å of the deposited films in an HF bath. Typically, once the films are etched, the Si—O—F bonds are weakened or broken and any free fluorine present would desorb. After the etch step, a 2000 Å PE CVD nitride layer was deposited and the wafer was annealed in the furnace for two (2) hours under similar conditions. These films also withstood the severe test with no bubbling seen.

The table below outlines the above-discussed results. The results show that the SOFO film can be used for low k Damascene applications. Similar results were found when the SOFO film was deposited on 200 mm wafers.

| Film | Dep Rate | % U | R1 | % F | As Deposited % F-NU | k | Integration |
|---|---|---|---|---|---|---|---|
| SiH$_4$ based | 7200 | 1.02 | 1.43 | 6 | 2.5 | 3.65 | Pass |
| SiF$_4$ only | 7400 | 2.81 | 1.43 | 6.4 | 1.5 | 3.4 | Pass |

| Film | Dep Rate | % U | R1 | % F | After Etch % F-NU | k | Integration |
|---|---|---|---|---|---|---|---|
| SiH$_4$ based | 7200 | 1.02 | 1.43 | 6 | 2.33 | 3.65 | Pass |
| SiF$_4$ only | 7400 | 2.81 | 1.43 | 6.4 | 2.5 | 3.4 | Pass |

Having fully described several embodiments of the present invention, many other equivalent or alternative methods of depositing the low dielectric constant oxide layer according to the present invention will be apparent to those skilled in the art. For example, SiO$_2$ or other materials may be used as the layer adjoining the FSG in lieu of Si$_x$N$_y$ layers. These alternatives and equivalents are intended to be included within the scope of the present invention.

What is claimed is:

1. A computer-readable storage medium having a computer-readable program embodied therein for directing operation of a substrate processing system including a process chamber, a plasma generation system, a substrate holder, and a gas-delivery system configured to introduce gases into said process chamber, said computer-readable program including instructions for operating said substrate processing system to form a thin film on a substrate disposed in said processing chamber in accordance with the following:

providing a gaseous mixture to the chamber, said gaseous mixture consisting essentially of silicon tetrafluoride, oxygen, and an inert gas, said gaseous mixture having an atomic-oxygen:atomic-silicon ratio that is at least about 3.0:1;

generating a high-density plasma from said gaseous mixture; and depositing a fluorinated silicate glass (FSG) layer onto said substrate using said plasma.

2. A substrate processing system comprising:

a housing defining a process chamber;

a plasma generating system operatively coupled to said process chamber;

a substrate holder configured to hold a substrate during substrate processing;

a gas-delivery system configured to introduce gases into said process chamber;

a pressure-control system for maintaining a selected pressure within said process chamber;

a controller for controlling said plasma generating system, said gas-delivery system, and said pressure-control system; and a memory coupled to said controller, said memory comprising a computer-readable medium having a computer-readable program embodied therein for directing operation of said substrate processing system, said computer-readable program including:

instructions to control said gas-delivery system to provide a gaseous mixture to said process chamber, said gaseous mixture comprising a first gas that contains both fluorine and silicon, and a second gas that contains oxygen, said gaseous mixture being substantially free of silane and having an atomic-oxygen:atomic-silicon ratio of at least 2.0:1;

instructions to control said plasma generating system to generate a high-density plasma from said gaseous mixture; and instructions to control said substrate processing system to deposit a fluorinated silicate glass (FSG) layer onto said substrate using said high-density plasma, said FSG layer being substantially free of hydrogen.

3. The system as in claim 2, wherein the atomic-oxygen:atomic silicon ratio is about 3.0:1 to about 6.0:1.

4. The system as in claim 2 wherein said first gas is silicon tetrafluoride and said second gas is oxygen.

5. The system as in claim 2 wherein said gaseous mixture further comprises an inert gas.

6. The system as in claim 5 wherein said inert gas is argon.

7. The system as in claim 2 wherein said substrate further comprises an etch stop layer disposed thereon, and said FSG layer is deposited over said etch stop layer.

8. The system as in claim 7 wherein said etch stop layer comprises a material selected from silicon nitride and silicon dioxide.

9. The computer-readable storage medium as in claim 1, wherein the atomic-oxygen:atomic-silicon ratio of said gaseous mixture is greater than about 3.0:1 and less than about 6.0:1.

10. The computer-readable storage medium as in claim 1 wherein said inert gas is argon.

11. The computer-readable storage medium as in claim 1 wherein said substrate further comprises an etch stop layer disposed thereon, and said FSG layer is deposited over said etch stop layer.

12. The computer-readable storage medium as in claim 11 wherein said etch stop layer comprises a material selected from silicon nitride and silicon dioxide.

13. The computer-readable storage medium as in claim 1 wherein said FSG layer is substantially free of hydrogen.

* * * * *